United States Patent
Raschke et al.

(10) Patent No.: US 12,405,540 B2
(45) Date of Patent: Sep. 2, 2025

(54) EXTREME ULTRAVIOLET INNER POD DISTRIBUTED SUPPORT

(71) Applicant: ENTEGRIS, INC., Billerica, MA (US)

(72) Inventors: Russ V. Raschke, Chanhassen, MN (US); Tyler Monforton, Chaska, MN (US)

(73) Assignee: ENTEGRIS, INC., Billerica, MA (US)

( * ) Notice: Subject to any disclaimer, the term of this patent is extended or adjusted under 35 U.S.C. 154(b) by 159 days.

(21) Appl. No.: 18/375,290

(22) Filed: Sep. 29, 2023

(65) Prior Publication Data

US 2024/0111222 A1 Apr. 4, 2024

Related U.S. Application Data

(60) Provisional application No. 63/411,525, filed on Sep. 29, 2022.

(51) Int. Cl.
*G03F 7/20* (2006.01)
*G03F 7/00* (2006.01)

(52) U.S. Cl.
CPC .............. *G03F 7/70741* (2013.01)

(58) Field of Classification Search
CPC .............. G03F 7/70741; G03F 1/66
See application file for complete search history.

(56) References Cited

U.S. PATENT DOCUMENTS

| | | |
|---|---|---|
| 2006/0260978 A1 | 11/2006 | Gregerson et al. |
| 2012/0175279 A1 | 7/2012 | Ku et al. |
| 2015/0266660 A1* | 9/2015 | Lystad .............. B65D 25/10 |
| | | 206/454 |
| 2021/0116821 A1 | 4/2021 | Chuang et al. |
| 2021/0294206 A1 | 9/2021 | Chuang et al. |

FOREIGN PATENT DOCUMENTS

WO 2021133553 A1 7/2021

* cited by examiner

*Primary Examiner* — Mesfin T Asfaw

(57) ABSTRACT

An apparatus includes an inner container having a baseplate and a cover, an outer container having a pod dome and a pod door, and a first set of pins and a second set of pins disposed on the pod door. The pod door has a locked state and an unlocked state. The first set of pins and the second set of pins are configured to support the baseplate. When the pod door is in the unlocked state and the first set of pins contacts the baseplate, a clearance is formed between the second set of pins and the baseplate. When the pod door is in the locked state, the first set of pins and the second set of pins contact the baseplate.

20 Claims, 7 Drawing Sheets

EXTREME ULTRAVIOLET INNER POD DISTRIBUTED SUPPORT

FIELD

This disclosure relates generally to substrate containers such as reticle pods used for reticles. More specifically, the disclosure relates to reticle pods having distributed support for inner pods of the reticle pods such as extreme ultraviolet (EUV) reticle pods, and the methods of producing the reticle pods.

BACKGROUND

Reticle pods are used for containing reticles such as, for example, photolithography masks used during semiconductor processing, such as during EUV treatment. Reticle pods can be used for storage and transport of reticles. A reticle pod can include an inner pod that is handled and manipulated by one or more tools during processing. The inner pod of the reticle pod includes a baseplate and a cover, and the baseplate and the cover contain the reticle and protect the reticle from contamination or physical damage during transport, storage, and processing. Reticle pods include, for example, EUV pods for use with EUV photolithography tools. Reticle pods can include an outer pod with a pod door and a pod dome, which contains the inner pod.

SUMMARY

This disclosure relates generally to substrate containers such as reticle pods used for reticles. More specifically, the disclosure relates to reticle pods having distributed support for inner pods of the reticle pods such as extreme ultraviolet (EUV) reticle pods, and the methods of producing the reticle pods.

In reticle pods, inner pods can be clamped within outer pods for shipment and transport within a fabrication facility. Cover clamping in the outer pod can be applied to locations around the four corners of the inner pod. The support to the baseplate of the inner pod can be at a plurality of points on the underside of baseplate referred to as pins such as kinematic coupling (KC) pins. The difference in the support and/or clamping locations from the cover to the baseplate of the inner pod can create high pressure areas above at least one of the KC pins as well as creating localized deformation on the inner pod. Such high pressure and deformation can lead to accelerated wear between the cover and the baseplate of the inner pod.

It will be appreciated that the grooves of the KC pins that interface with the inner pod baseplate can be specified in the SEMI (an industry association including companies involved in the electronics design and manufacturing supply chain) and ASML (Advanced Semiconductor Materials Lithography) RPDM (Reticle Pod Design Manual) in order to properly interface with different tools in a fab (i.e., a microchip fabrication plant). It is also important to have accurate locational control of the inner pod to allow accurate interfacing with the inner pod and possibly reticle in on the inner pod baseplate. Other pins such as safety catch pins can be intentionally in clearance with the baseplate so that the safety catch pins can minimize tilt during loading and do not interfere with accurate alignment of the inner pod on the KC pins.

Embodiments disclosed herein can provide compliant KC pins so that when the outer pod clamps the inner pod, most of the support can be supplied by the safety catch pins. For example, embodiments disclosed herein can provide a housing of the pod door compliant in the thickness or height direction, and/or provide spring-loaded KC pins. Embodiments disclosed herein can provide safety catch pins to be active or actuated such that the safety catch pins can be driven inward (i.e., in a direction toward the baseplate) when the pod door is latched or locked (which is when the load is applied). For example, the safety catch pins can be driven by the pod door latch cam and/or latch arms.

In an embodiment, an apparatus includes an inner container having a baseplate and a cover, an outer container having a pod dome and a pod door, and a first set of pins and a second set of pins disposed on the pod door. The pod door has a locked state and an unlocked state. The first set of pins and the second set of pins are configured to support the baseplate. When the pod door is in the unlocked state and the first set of pins contacts the baseplate, a clearance is formed between the second set of pins and the baseplate. When the pod door is in the locked state, the first set of pins and the second set of pins contact the baseplate.

In an embodiment, the outer container includes clamping mechanisms. When the pod door is in the locked state, clamping forces exerted from the clamping mechanisms on the cover are not aligned with the first set of pins in a height direction of the inner container.

In an embodiment, the clearance ranges from at or about 0.1 millimeters to at or about 0.2 millimeters.

In an embodiment, at least one pin of the first set of pins is compliant in a height direction of the inner container.

In an embodiment, the at least one pin is a spring-loaded pin.

In an embodiment, the pod door includes a compliant base to support the at least one pin.

In an embodiment, the second set of pins is configured to be activated when the pod door is transitioned from the unlocked state to the locked state. When the second set of pins is activated, each pin of the second set of pins is pushed toward the baseplate and contacts the baseplate.

In an embodiment, the pod door includes a latch arm. When the pod door is transitioned from the unlocked state to the locked state, the latch arm pushes the second set of pins toward the baseplate so that the second set of pins contacts the baseplate.

In an embodiment, the pod door includes a door cam. When the pod door is transitioned from the unlocked state to the locked state, the door cam drives the second set of pins toward the baseplate so that the second set of pins contacts the baseplate.

In an embodiment, the apparatus further includes a support pin disposed on the pod door.

In an embodiment, an apparatus includes an inner container having a baseplate and a cover, an outer container having a pod dome and a pod door, and a first set of pins and a second set of pins disposed on the pod door. The pod door has a locked state and an unlocked state. The first set of pins and the second set of pins are configured to support the baseplate. A method of producing the apparatus includes preparing the first set of pins and the second set of pins so that when the pod door is in the unlocked state and the first set of pins contacts the baseplate, a clearance is formed between the second set of pins and the baseplate, and when the pod door is in the locked state, the first set of pins and the second set of pins contact the baseplate.

In an embodiment, the method includes preparing clamping mechanisms of the outer container so that when the pod door is in the locked state, clamping forces exerted from the clamping mechanisms on the cover are not aligned with the first set of pins in a height direction of the inner container.

In an embodiment, the clearance ranges from at or about 0.1 millimeters to at or about 0.2 millimeters.

In an embodiment, the method includes preparing at least one pin of the first set of pins so that the at least one pin is compliant in a height direction of the inner container.

In an embodiment, the at least one pin is a spring-loaded pin.

In an embodiment, the method includes preparing a compliant base of the pod door to support the at least one pin.

In an embodiment, the method includes preparing the second set of pins to be activated when the pod door is transitioned from the unlocked state to the locked state. When the second set of pins is activated, each pin of the second set of pins is pushed toward the baseplate and contacts the baseplate.

In an embodiment, the method includes preparing a latch arm of the pod door so that when the pod door is transitioned from the unlocked state to the locked state, the latch arm pushes the second set of pins toward the baseplate so that the second set of pins contacts the baseplate.

In an embodiment, the method includes preparing a door cam of the pod door so that when the pod door is in the locked state, the door cam drives the second set of pins toward the baseplate so that the second set of pins contacts the baseplate.

In an embodiment, the method includes preparing a support pin disposed on the pod door.

BRIEF DESCRIPTION OF THE DRAWINGS

References are made to the accompanying drawings that form a part of this disclosure and which illustrate the embodiments in which systems and methods described in this specification can be practiced.

Like reference numbers represent like parts throughout.

DETAILED DESCRIPTION

Figure 1:
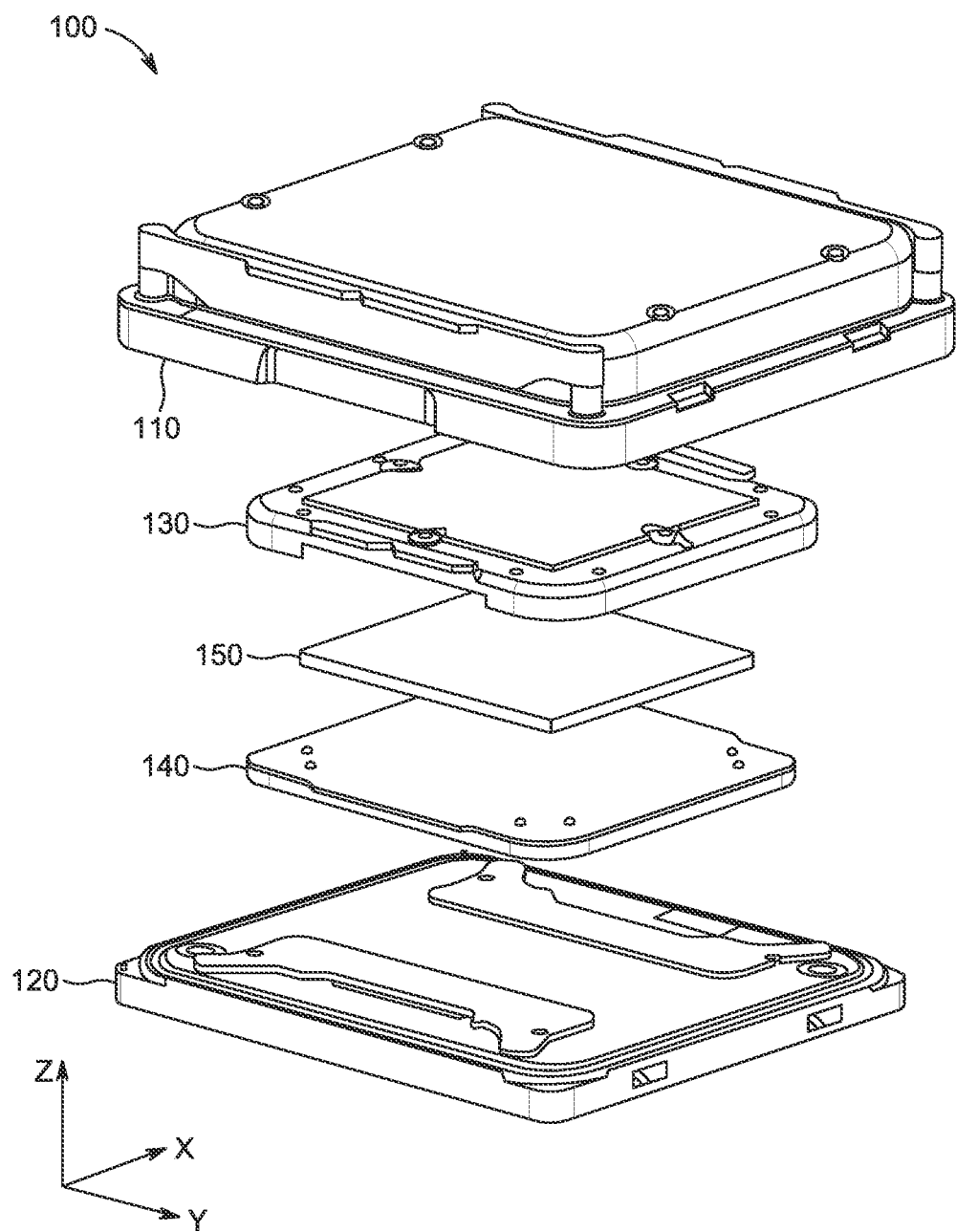
FIG. 1 is a perspective view of a reticle pod, according to an embodiment.

This disclosure relates generally to substrate containers such as reticle pods used for reticles. More specifically, the disclosure relates to reticle pods having distributed support for inner pods of the reticle pods such as extreme ultraviolet (EUV) reticle pods, and the methods of producing the reticle pods.

It will be appreciated that EUV inner pods can be supported inside the EUV outer pod by a plurality of KC pins (e.g., three KC pins). The embodiments described and recited herein are not limited to the number of pins described. That is, the number of pins described and recited herein are provided for descriptive purposes only and are not intended to be limiting. The physics of these coupling systems has the support located in three locations localizing support that may not align with the clamping required for the reticle and typically used outer pod locations. Specifically, the KC pin located at the "rear" of the inner pod or outer pod is centered on the baseplate while the cover clamps are at the corners. This can result in high pressure over the rear KC pin as well as deformation that creates sliding motion between the cover and baseplate.

Embodiments disclosed herein can provide a compliant rear KC pin structure such that under clamping of the outer pod, the inner pod can move down and be supported in the corners by additional support features (e.g., safety catch pins). Embodiments disclosed herein can also make the additional support features rise to support the inner pod when the outer pod latches, evening the pressure on the inner pod. Compliant (e.g., spring-loaded or the like) KC pin structure can allow distributed support of the inner pod. It will be appreciated that if the KC pin is a spring-loaded pin, the KC pin may need to be designed to have a solid stop when not compressed by the outer pod clamping to maintain positional accuracy.

It will be appreciated that as defined herein, the term "pin" may refer to any suitable supporting mechanism including, but not limited to, a pin, a pad, a post, a rib, a wall, or the like.

Particular embodiments of the present disclosure are described herein with reference to the accompanying drawings; however, it is to be understood that the disclosed embodiments are merely examples of the disclosure, which can be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. In this description, as well as in the drawings, like-referenced numbers represent elements that can perform the same, similar, or equivalent functions.

The scope of the disclosure should be determined by the appended claims and their legal equivalents, rather than by the examples given herein. For example, the steps recited in any method claims can be executed in any order and are not limited to the order presented in the claims. Moreover, no element is essential to the practice of the disclosure unless specifically described herein as "critical" or "essential".

Some embodiments of the present application are described in detail with reference to the accompanying drawings so that the advantages and features of the present application can be more readily understood by those skilled in the art. The terms "near", "far", "top", "bottom", "left", "right", and the like described in the present application are defined according to the typical observation angle of a person skilled in the art and for the convenience of the description. These terms are not limited to specific directions.

FIG. 1 is a perspective view of a reticle pod 100, according to an embodiment. The reticle pod 100 includes an inner pod (130 and 140) and an outer pod (110 and 120). For example, the reticle pod 100 can be, but is not limited to, a reticle pod for EUV processing of photolithography masks, or the like. In an embodiment, the reticle pod 100 has a length direction (the X direction), a width direction (the Y direction), and a thickness or height direction (the Z direction).

The inner pod (130 and 140) has an internal space with a reticle containment portion for containing a reticle 150. The inner pod (130 and 140) includes a cover 130 and a baseplate 140. The cover 130 and the baseplate 140 are configured to be joined together. When joined together, the cover 130 and the baseplate 140 define an internal space sized and shaped to contain the reticle 150. The reticle 150 can be, but is not limited to, a photolithography mask that will be used in EUV processing, etc.

The outer pod (110 and 120) includes a pod dome 110 and a pod door 120. The outer pod (110 and 120) is configured to accommodate the inner pod (130 and 140) within an internal space defined by the pod dome 110 and the pod door 120. The pod dome 110 can be secured to the pod door 120 to enclose the internal space and contain the inner pod (130 and 140), for example during transport and handling of the reticle pod 100. The pod dome 110 and the pod door 120 can each include or be made entirely of one or more polymer materials or any other suitable materials.

Figure 2A:
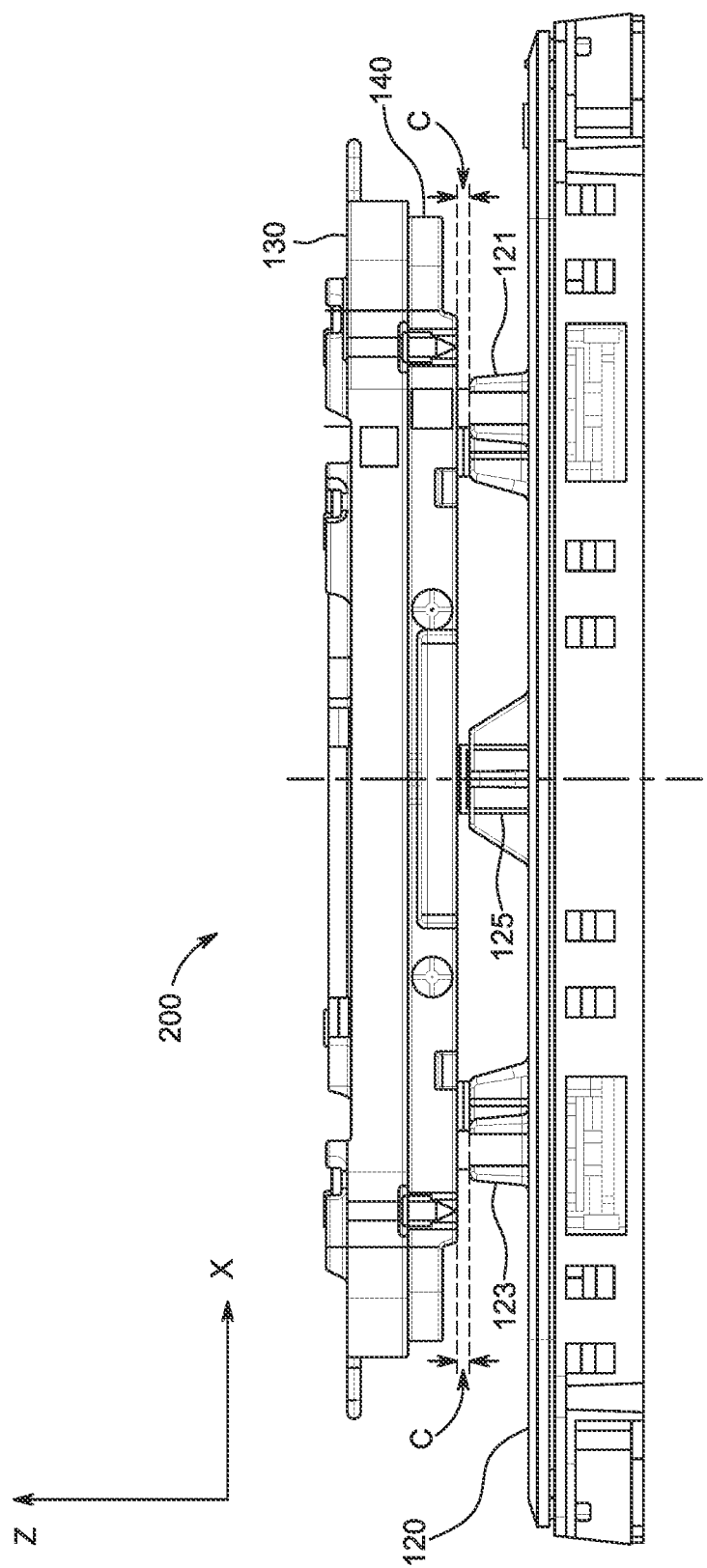
FIG. 2A is a front perspective view of a portion of a reticle pod, according to an embodiment.
Figure 2B:
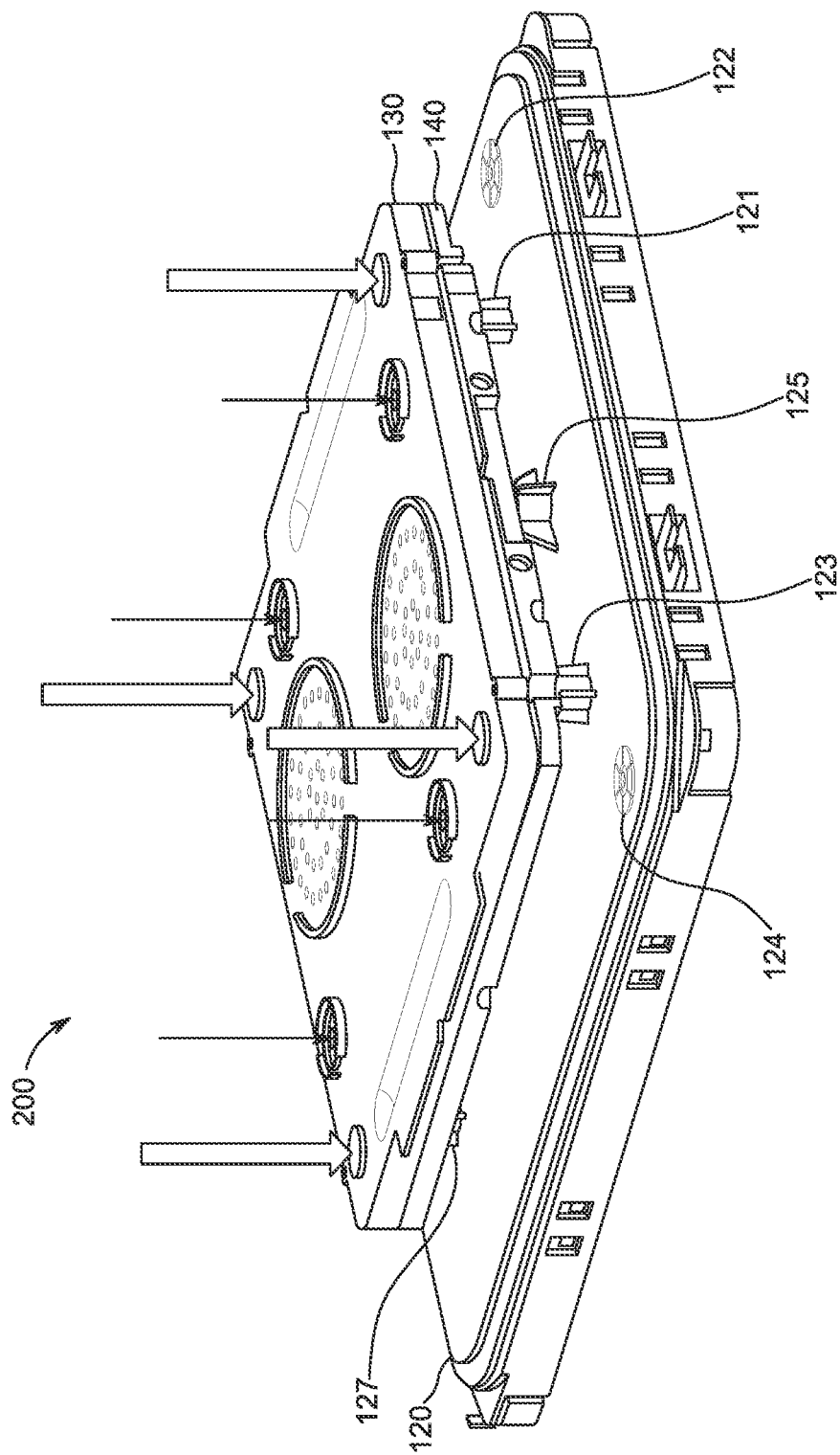
FIG. 2B is a front left side perspective view of the reticle pod of FIG. 2A, according to an embodiment.

FIG. 2A is a front side perspective view of a portion of a reticle pod 200, according to an embodiment. FIG. 2B is a front left side perspective view of the reticle pod 200 of FIG. 2A, according to an embodiment.

As shown in FIGS. 2A and 2B, the reticle pod 200 includes an inner pod and an outer pod. The inner pod (130 and 140) includes a cover 130 and a baseplate 140. The internal space of the inner pod (130 and 140) is enclosed (e.g., closed) by placing the cover 130 on the baseplate 140. The cover 130 directly contacts the baseplate 140. The inner pod (130 and 140) can be opened by moving the cover 130 away from the baseplate 140 (e.g., by moving the cover 130 upwards in the Z direction, etc.). For example, an external tool (e.g., automated arm, etc.) can open the inner pod (130 and 140) to access the reticle containment portion and remove the reticle (e.g., 150 of FIG. 1).

The outer pod includes a pod dome (not shown, see 110 of FIG. 1) and a pod door 120. The outer pod can be configured to accommodate the inner pod (130 and 140) within an internal space defined by the pod dome and the pod door 120. The pod door 120 can have a locked (e.g., latched) state and an unlocked (e.g., unlatched) state. When the pod door 120 is in the locked state, the pod door 120 is locked (e.g., latched, which is when the load or the clamping pressure is applied to the cover 130), and the pod dome can be secured to the pod door 120 to enclose the internal space and contain the inner pod (130 and 140), for example, during transport and handling of the reticle pod 200. When the pod door 120 is in the unlocked state, the pod door 120 is unlocked (e.g., unlatched), and the pod dome can be unsecured from the pod door 120.

The inner pod (130 and 140) and/or the baseplate 140 can be supported by the pod door 120. A first set of pins (125, 127, 129, see also FIG. 3), such as kinematic coupling (KC) pins or the like, can be disposed on the pod door 120 to support the inner pod (130 and 140) and/or the baseplate 140. That is, the support to the baseplate 140 of the inner pod (130 and 140) can be at points (e.g., three or any suitable number) on the underside of baseplate referred to as e.g., KC pins (125, 127, 129). A second set of pins (121 and 123), such as safety catch pins or the like, can also be disposed on the pod door 120. The second set of pins (121 and 123) can also be configured to support the inner pod (130 and 140) and/or the baseplate 140, e.g., when the pod door 120 is in the locked state.

As shown in FIGS. 2A, the pod door 120 is in the unlocked state, each of the KC pins (125, 127, 129) contacts the baseplate, and a clearance C is formed between each of the safety catch pins (121 and 123) and the baseplate 140. In an embodiment, the clearance C ranges from at or about 0.1 millimeters to at or about 0.2 millimeters. It will be appreciated that a weight of the inner pod (130 and 140) typically ranges from at or about one pound to at or about 1.5 pounds, and when the pod door 120 is in the unlocked state, the pressure caused by the weight of the inner pod (130 and 140) may not cause the clearance C to be reduced.

It will also be appreciated that when the pod door 120 is in the unlocked state, the clearance C between the safety catch pins (121 and 123) and the baseplate 140 can serve as an indicator regarding whether the KC pins (125, 127, 129) are located accurately e.g., by ensuring that there is no contact between the baseplate 140 and the safety catch pins (121 and 123). For the KC pins (125, 127, 129) arrangement to function properly, the baseplate 140 needs to directly and fully contact each of the KC pins (125, 127, 129) when the pod door 120 is in the unlocked state. If the baseplate 140 directly contact the safety catch pins (121 and 123) when the pod door 120 is in the unlocked state, this can be an indication that the baseplate 140 is not correctly centered. That is, when the pod door 120 is in the unlocked state, safety catch pins (121 and 123) have to be in clearance with respect to the baseplate 140 for the KC pins (125, 127, 129) to function properly for their locational features and/or accuracy. In other words, the safety catch pins (121, 123) are intentionally in clearance so that the safety catch pins (121, 123) do not interfere with the accurate alignment of the inner pod (130, 140) on the KC pins (125, 127, 129).

When the pod door 120 is in the locked state, the inner pod (130 and 140) can be clamped in the outer pods (110, 120) for shipment and within fab transport. As shown as block arrows in FIG. 2B, cover clamping by the outer pod (110, 120) can be located around the four corners of the inner pod (130 and 140). Reticle clamping is shown as the vertical arrows near the cover clamping. Filter inlets (or purge inlets) (122, 124) can be disposed on or in or through the pod door 120. When the outer pod (110, 120) clamps the inner pod (130, 140), e.g., when the pod door 120 is transitioning from the unlocked state to the locked state, under clamping of the outer pod (110, 120), the inner pod (130, 140) can move down (e.g., in the Z direction) and be supported by the additional support features (e.g., the safety catch pins (121, 123)). That is, when the pod door 120 is in the locked state, both the KC pins (125, 127, 129) and the safety catch pins (121, 123) directly and fully contact the baseplate 140. In an embodiment, the clamp location (i.e., each of the block arrows in FIG. 2B) can generate at or around seven pounds of force at each corner of the inner pod (130, 140). It will be appreciated that the KC pins (125, 127, 129) can be designed to have a solid stop when not compressed by the outer pod clamping to maintain positional accuracy.

Figure 3:
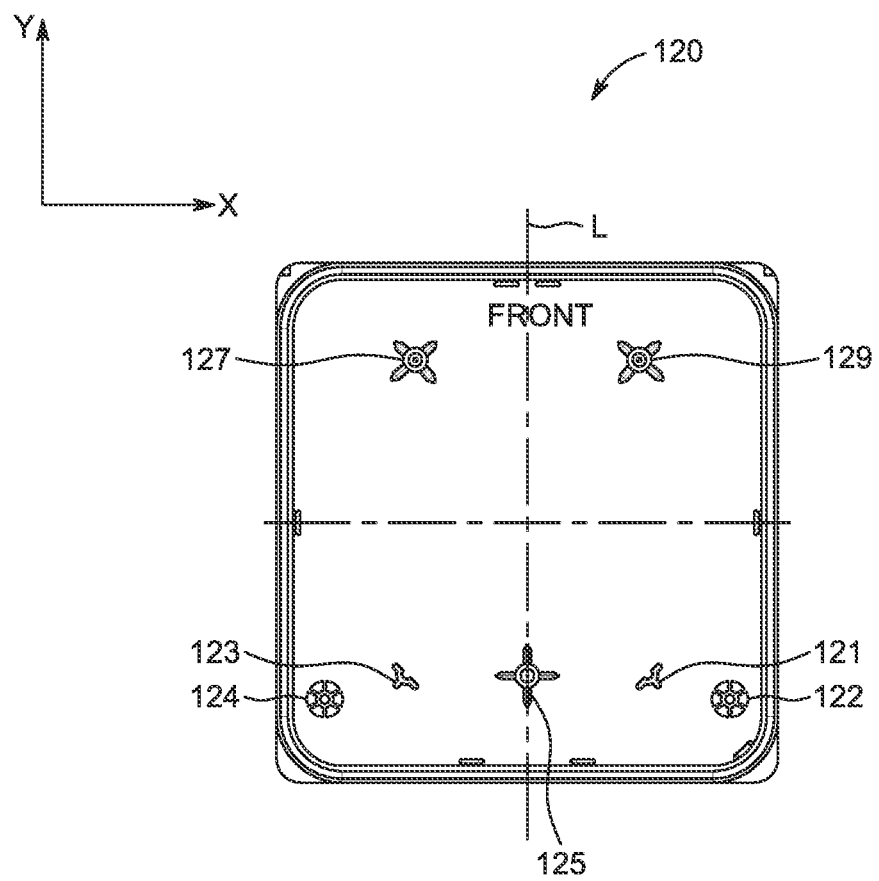
FIG. 3 is a top view of a pod door of an outer pod, according to an embodiment.

FIG. 3 is a top view of a pod door 120 of an outer pod, according to an embodiment. KC pins (125, 127, 129), safety catch pins (121, 123), and filter inlets (122, 124) are disposed on the pod door 120. It will be appreciated that the embodiments described and recited herein are not limited to the number and location of the pins and/or inlets described. That is, the number and location of the pins and/or inlets described and recited herein are provided for descriptive purposes only and are not intended to be limiting.

As shown in FIG. 3, the rear KC pin 125 is disposed near or on a middle line L of the pod door 120 at a location close to a bottom of the pod door 120 in a plan view. Front KC pins (127, 129) are disposed symmetrically along the middle line L at locations close to a top of the pod door 120 in the plan view. Safety catch pins (121, 123) are disposed symmetrically along the middle line L at locations close to the bottom of the pod door 120 in the plan view. Filter inlets (122, 124) are disposed symmetrically along the middle line L at locations close to the bottom of and close to sides of the pod door 120 in the plan view. The rear KC pin 125 and the safety catch pins (121, 123) can be substantially aligned with each other in the X direction.

In an embodiment (see e.g., FIGS. 2B and 3), when the pod door 120 is in the locked state, clamping forces (see e.g., the block arrows in FIG. 2B in the Z direction) exerted from the clamping mechanisms (e.g., cover clamping of the outer pod (110, 120) or the like) on the cover 130 are not aligned with the KC pins (125, 127, 129) in the Z direction. The difference in the support (from the KC pins) and the clamping locations (see e.g., the block arrows in FIG. 2B) from the cover 130 to the baseplate 140 may create high pressure areas above at least the rear KC pin 125 as well as localized deformation. Such high pressure and deformation may lead to accelerated wear between the cover 130 and baseplate 140. Embodiments disclosed herein can help to distribute such pressure to reduce or spread the wear from a particular location (the rear KC pin 125 or other KC pins or the like) to other locations to reduce an aggressiveness or severity of the wear in the particular location where a user may be aware of or concerned about.

Figure 4A:
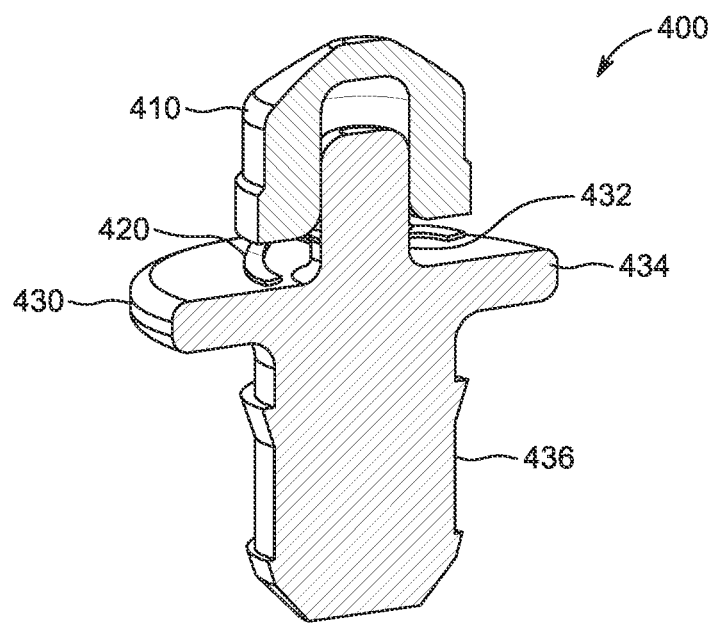
FIG. 4A is a cross-sectional perspective view of a kinematic coupling pin, according to an embodiment.
Figure 4B:
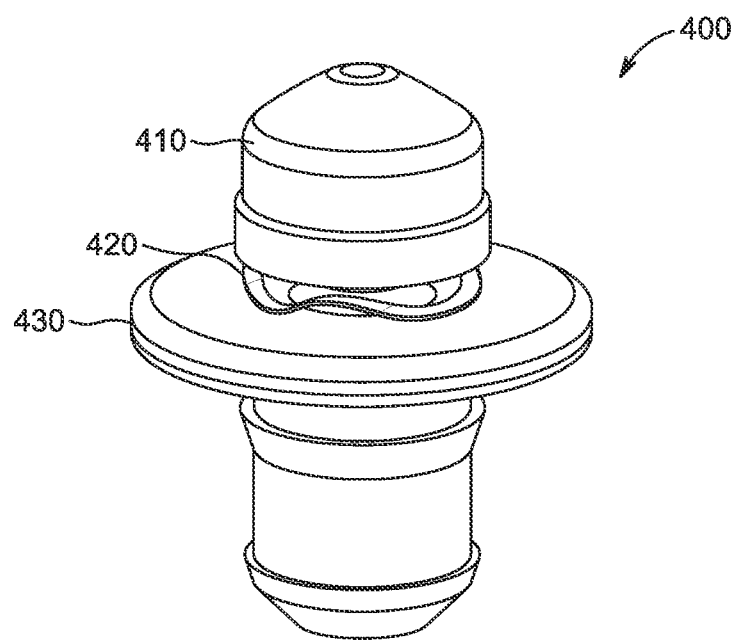
FIG. 4B is a perspective view of the kinematic coupling pin of FIG. 4A, according to an embodiment.

FIG. 4A is a cross-sectional perspective view of a KC pin 400, according to an embodiment. FIG. 4B is a perspective view of the KC pin 400 of FIG. 4A, according to an embodiment. The KC pin 400 can be any one of the KC pins (125, 127, 129) of FIGS. 2A-3.

It will be appreciated that the embodiments described and recited herein are not limited to the structure and implementation of the KC pins described. That is, the structure and implementation of the KC pins described and recited herein are provided for descriptive purposes only and are not intended to be limiting.

In an embodiment, the KC pin 400 can be a spring-loaded pin. As shown in FIGS. 4A and 4B, the KC pin 400 can include a cap 410, a compressible member (e.g., a wave-washer, a spring, or the like) 420, and a body 430. The body 430 includes a tip 432, a shoulder 434, and an end 436. The tip 432 can be accommodated in a recess of the cap 410. The wave-washer 420 can be disposed surrounding the tip 432 and on the shoulder 434 to support the tip 432.

In an embodiment, the cap 410 can be made of polymer (e.g., polyethylene or the like) or any suitable material(s). The wave-washer 420 can be made of stainless steel or any suitable material. The cap 410 can slide on the tip 432. It will be appreciated that the tip 432 (along with the wave-washer 420) can be configured to have compliance in the Z direction while maintaining lateral rigidity. The KC pin 400 can be compliant in the Z direction. When the outer pod (110, 120) claims down on the cover 130 of the inner pod (130, 140), e.g., when the pod door 120 is transitioned from the unlocked state to the locked state, the KC pin 400 can be squeezed down (e.g., by the baseplate on the cap 410) a certain distance (e.g., ranging from at or about 0.1 millimeters to at or about 0.2 millimeters) under a certain amount of force or loading (e.g., ranging from at or about four pounds to at or about five pounds). It will be appreciated that such distance can equal the clearance C of FIG. 2A, so that when the pod door 120 is in the locked state, both the KC pins (125, 127, 129) and the safety catch pins (121, 123) directly and fully contact the baseplate 140 such that the clamping force or pressure (at or about seven pounds at each clamping location) can be distributed from the baseplate 140 to the KC pins (125, 127, 129) and also the safety catch pins (121, 123). That is, at the rear end of the pod door 120, the safety catch pins (121, 123) and the rear KC pin 125 can supply support to counter the clamping pressure (e.g., at or about 14 pounds at the rear end of the pod door 120).

When the pod door 120 is transitioned from the locked state to the unlocked state, the wave-washer 420 on the shoulder 434 of the KC pin 400 can push the cap 410 back up the certain distance (e.g., ranging from at or about 0.1 millimeters to at or about 0.2 millimeters) to the previous position (before being squeezed) of the KC pin 400.

Figure 5:
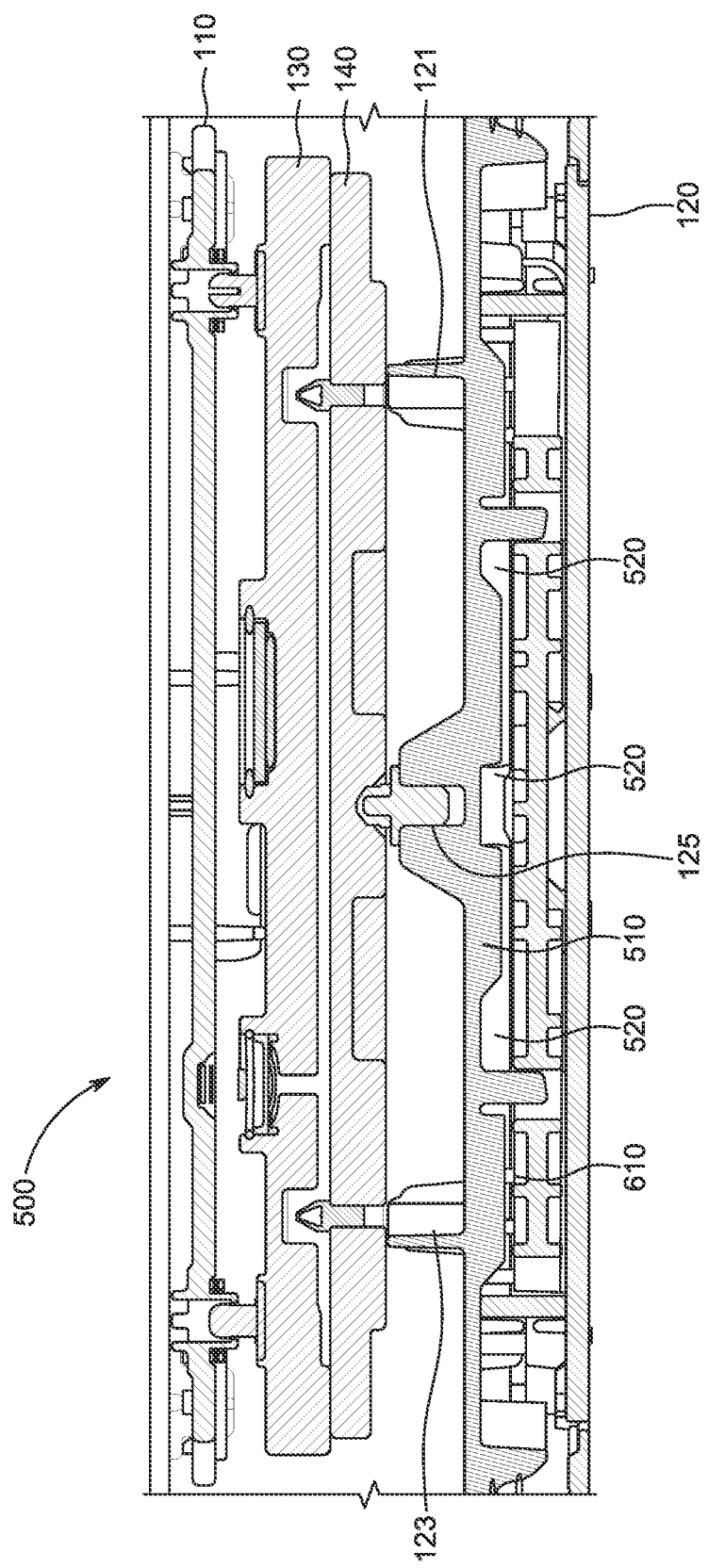
FIG. 5 is a cross-sectional view of a reticle pod, according to an embodiment.

FIG. 5 is a cross-sectional view of a reticle pod 500, according to an embodiment. The reticle pod 500 can be the reticle pod (100 and/or 200) described above. The reticle pod 500 includes an inner pod (the cover 130 and the baseplate 140) and an outer pod (the pod dome 110 and a pod door 120). The housing of the pod door 120 includes a base 510 to support the KC pins (125, 127, 129) and includes a plurality of ribbing structures 520 underneath the base 510. In an embodiment, a minimum thickness of the base 510 can range from at or about two millimeters to at or about 2.5 millimeters.

In an embodiment, the housing of the pod door 120 such as the base 510 and the ribbing structures 520 (that underneath the KC pin(s)) can be configured to be compliant in the Z direction. Some ribbing structures can be removed and/or additional ribbing structures can be added to achieve the desired compliance.

When the outer pod (110, 120) clamps down on the cover 130 of the inner pod (130, 140), e.g., when the pod door 120 is transitioned from the unlocked state to the locked state, the housing of the pod door 120 can be squeezed down (e.g., by the KC pin(s) (125, 127, 129)) a certain distance (e.g., ranging from at or about 0.1 millimeters to at or about 0.2 millimeters) under a certain amount of force or loading (e.g., ranging from at or about four pounds to at or about five pounds). It will be appreciated that such distance can equal the clearance C of FIG. 2A, so that when the pod door 120 is in the locked state, both the KC pins (125, 127, 129) and the safety catch pins (121, 123) directly and fully contact the baseplate 140 such that the clamping force or pressure (at or about seven pounds at each clamping location) can be distributed from the baseplate 140 to the KC pins (125, 127, 129) and the safety catch pins (121, 123). That is, at the rear end of the pod door 120, the safety catch pins (121, 123) and the rear KC pin 125 can supply support to counter the clamping pressure (at or about 14 pounds at the rear end of the pod door 120).

When the pod door 120 is transitioned from the locked state to the unlocked state, the housing of the pod door 120 such as the base 510 and the ribbing structures 520 can push the KC pin(s) (125, 127, 129) back up the certain distance (e.g., ranging from at or about 0.1 millimeters to at or about 0.2 millimeters) to the previous position (before being squeezed) of the KC pin(s) (125, 127, 129).

It will be appreciated that the embodiments described and recited herein are not limited to the housing structure (such as the base 510 and the ribbing structures 520) and implementation of the pod door 120 described. That is, the housing structure and implementation of the pod door 120 described and recited herein are provided for descriptive purposes only and are not intended to be limiting.

Figure 6:
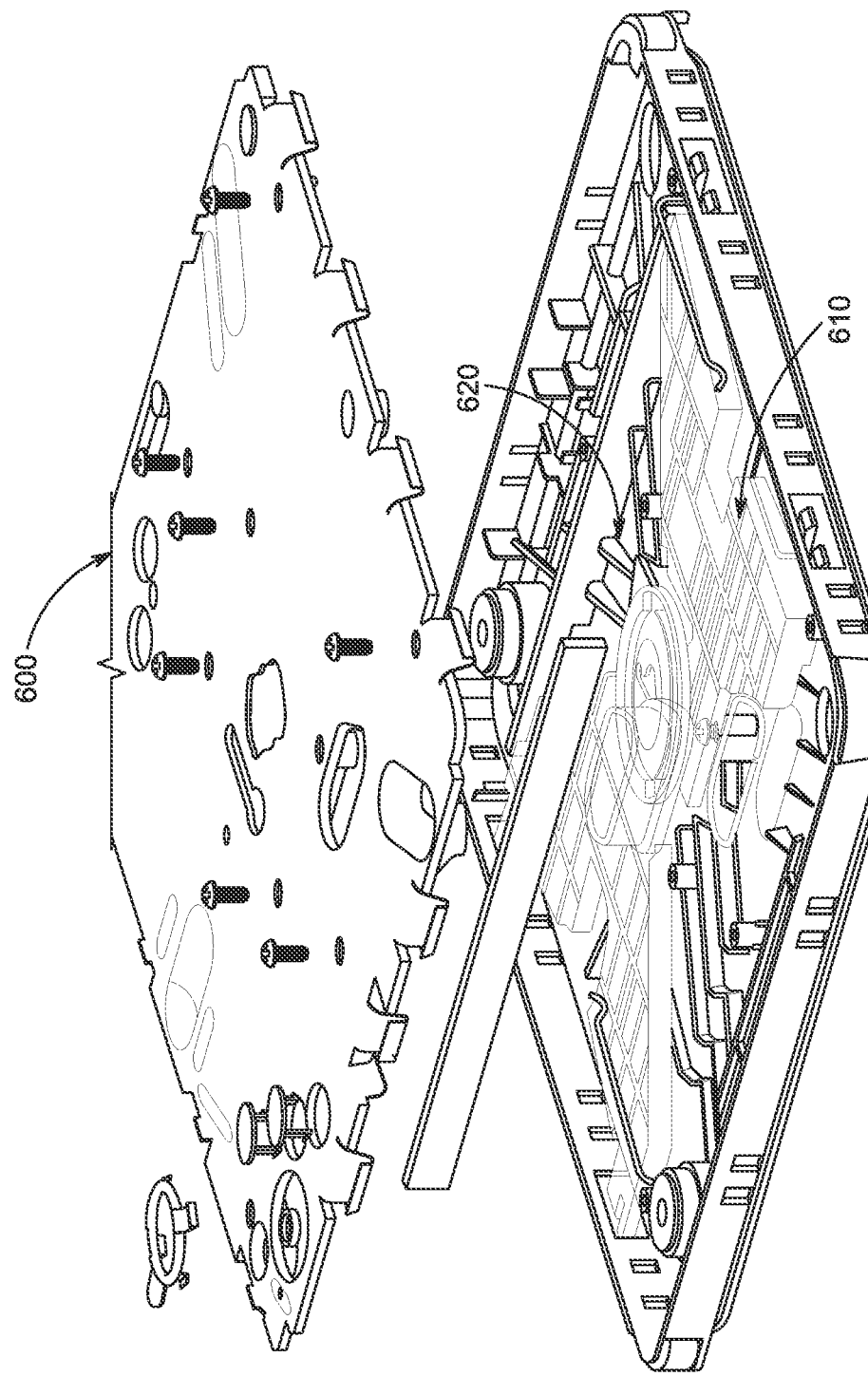
FIG. 6 is an exploded view of a portion of a pod door, according to an embodiment.

FIG. 6 is an exploded view of a portion of a pod door 600 (in an up-side-down position with respect to the pod door 120 of FIG. 5), according to an embodiment. The pod door 600 can be the pod door 120 described above.

The pod door 600 includes a door cam 620 and latch arm(s) 610 (also marked as 610 in FIG. 5). Ramp(s) (not shown) on the underside of the latch arm(s) 610 can be provided so that when the door cam 620 drives the latch arms outward (e.g., when the pod door 600 is transitioned from the unlocked state to the locked state), the latch arm(s) 610 can move up along the ramp(s) to push the safety catch pins (121, 123) up towards the baseplate 140. It will be appreciated that in another embodiment, the ramp(s) can be optional, and when the door cam 620 drives the latch arms outward (e.g., when the pod door 600 is transitioned from the unlocked state to the locked state), the latch arm(s) 610 can push the safety catch pins (121, 123) up towards the baseplate 140. In yet another embodiment, when the pod door 600 is transitioned from the unlocked state to the locked state, the door cam 620 can drive the safety catch pins (121, 123) up towards the baseplate 140.

In an embodiment, when the outer pod claims down on the cover 130 of the inner pod, e.g., when the pod door 600 is transitioned from the unlocked state to the locked state, the door cam 620 can drive the latch arm(s) 610 outwards, and the latch arm(s) 610 can move up along the ramp(s) to push the safety catch pins (121, 123) up (e.g., via the base 510 underneath the safety catch pins) towards the baseplate 140 a certain distance (e.g., ranging from at or about 0.1 millimeters to at or about 0.2 millimeters) under a certain amount of force or loading (e.g., ranging from at or about four pounds to at or about five pounds).

It will be appreciated that such distance can equal the clearance C of FIG. 2A, so that when the pod door 600 is in the locked state, both the KC pins (125, 127, 129) and the safety catch pins (121, 123) directly and fully contact the baseplate 140 such that the clamping force or pressure (at or about seven pounds at each clamping location) can be distributed from the baseplate 140 to the KC pins (125, 127, 129) and the safety catch pins (121, 123). That is, at the rear end of the pod door 600, the safety catch pins (121, 123) and the rear KC pin 125 can supply support to counter the clamping pressure (e.g., at or about 14 pounds at the rear end of the pod door 600). When the pod door 600 is in the locked state, the safety catch pins (121, 123) are activated (e.g., being pushed (e.g., by the latch arm(s) 610 or by the door cam 610) toward the baseplate 140 and contacting the baseplate 140).

In an embodiment, when the pod door 600 is transitioned from the locked state to the unlocked state, the door cam 620 can drive the latch arm(s) 610 inwards, and the latch arm(s) 610 can move down along the ramp(s) to retreat the safety catch pins (121, 123) down (e.g., via the base 510 underneath the safety catch pins) the certain distance (e.g., ranging from at or about 0.1 millimeters to at or about 0.2 millimeters) to the previous position (before being pushed up) of the safety catch pins (121, 123). It will be appreciated that in another embodiment, the ramp(s) can be optional, and when the door cam 620 drives the latch arms inwards, the latch arm(s) 610 can retreat the safety catch pins (121, 123) down (e.g., via the base 510 underneath the safety catch pins) the certain distance to the previous position (before being pushed up) of the safety catch pins (121, 123). In yet another embodiment, when the pod door 600 is transitioned from the locked state to the unlocked state, the door cam 620 can retreat the safety catch pins (121, 123) down the certain distance to the previous position of the safety catch pins (121, 123).

In an embodiment, one of more of support pins (not shown) can be disposed on the pod door 600. For example, a support pin can be disposed between the front KC pins 127 and 129. The support pin can also be disposed between the KC pins 125 and 127, between the KC pins 125 and 129, or at any suitable location. The support pin (e.g., a height or a compliance of the support pin) can be configured to reduce and/or equalize the pressure on the front KC pins 127 and 129 when the pod door 600 is in the locked state.

It will be appreciated that the embodiments described and recited herein are not limited to the structure and implementation of the pod door 600 described. That is, the structure and implementation of the pod door 600 described and recited herein are provided for descriptive purposes only and are not intended to be limiting.

Embodiments disclosed herein can provide method(s) of preparing one or more components of the reticle pod as described above. The prepared reticle pod can help to distribute forces (e.g., caused by clamping forces) to e.g., prevent wear generation over cycling.

It will be appreciated that on existing reticle pods, FEA (finite element analysis) has been performed to indicate areas of high pressure. Wear studies indicate consistent contact and wear marks above the rear KC pin of the KC pins and/or other locations. Shimmed safety catch pins or pads to eliminate space or clearance have been tested and the tests have shown eliminated wear on a set of baseplates of the inner pod that previously wore in the location above the rear KC pin and/or other locations.

It will also be appreciated that the FEA and the tests have shown that the high pressure related to the difference in clamping locations from the cover to the baseplate of the inner pod can result in wear above the rear KC pin of the pins. Embodiments disclosed herein can reduce such high pressure and still accurately constrain the inner pod. Embodiments disclosed herein can provide a support structure under the inner pod in an outer pod more even to reduce localized pressure and movement due to bending.

Aspects:

Any one of the aspects can be combined with each other.

Aspect 1. An apparatus comprising: an inner container having a baseplate and a cover; an outer container having a pod dome and a pod door, the pod door having a locked state and an unlocked state; and a first set of pins and a second set of pins disposed on the pod door, the first set of pins and the second set of pins being configured to support the baseplate, wherein when the pod door is in the unlocked state and the first set of pins contacts the baseplate, a clearance is formed between the second set of pins and the baseplate, when the pod door is in the locked state, the first set of pins and the second set of pins contact the baseplate.

Aspect 2. The apparatus according to aspect 1, wherein the outer container includes clamping mechanisms, when the pod door is in the locked state, clamping forces exerted from the clamping mechanisms on the cover are not aligned with the first set of pins in a height direction of the inner container.

Aspect 3. The apparatus according to aspect 1 or aspect 2, wherein the clearance ranges from at or about 0.1 millimeters to at or about 0.2 millimeters.

Aspect 4. The apparatus according to any one of aspects 1-3, wherein at least one pin of the first set of pins is compliant in a height direction of the inner container.

Aspect 5. The apparatus according to aspect 4, wherein the at least one pin is a spring-loaded pin.

Aspect 6. The apparatus according to aspect 4, wherein the pod door includes a compliant base to support the at least one pin.

Aspect 7. The apparatus according to any one of aspects 1-6, wherein the second set of pins is configured to be activated when the pod door is transitioned from the unlocked state to the locked state, when the second set of pins is activated, each pin of the second set of pins is pushed toward the baseplate and contacts the baseplate.

Aspect 8. The apparatus according to aspect 7, wherein the pod door includes a latch arm, when the pod door is transitioned from the unlocked state to the locked state, the latch arm pushes the second set of pins toward the baseplate so that the second set of pins contacts the baseplate.

Aspect 9. The apparatus according to aspect 7, wherein the pod door includes a door cam, when the pod door is transitioned from the unlocked state to the locked state, the door cam drives the second set of pins toward the baseplate so that the second set of pins contacts the baseplate.

Aspect 10. The apparatus according to any one of aspects 1-9, further comprising: a support pin disposed on the pod door.

Aspect 11. A method of producing an apparatus, the apparatus including an inner container having a baseplate and a cover, an outer container having a pod dome and a pod door, the pod door having a locked state and an unlocked state; and a first set of pins and a second set of pins disposed on the pod door, the first set of pins and the second set of pins being configured to support the baseplate, the method comprising: preparing the first set of pins and the second set of pins so that when the pod door is in the unlocked state and the first set of pins contacts the baseplate, a clearance is formed between the second set of pins and the baseplate, and when the pod door is in the locked state, the first set of pins and the second set of pins contact the baseplate.

Aspect 12. The method according to aspect 11, further comprising: preparing clamping mechanisms of the outer container so that when the pod door is in the locked state, clamping forces exerted from the clamping mechanisms on the cover are not aligned with the first set of pins in a height direction of the inner container.

Aspect 13. The method according to aspect 11 or aspect 12, wherein the clearance ranges from at or about 0.1 millimeters to at or about 0.2 millimeters.

Aspect 14. The method according to any one of aspects 11-13, further comprising: preparing at least one pin of the first set of pins so that the at least one pin is compliant in a height direction of the inner container.

Aspect 15. The method according to aspect 14, wherein the at least one pin is a spring-loaded pin.

Aspect 16. The method according to aspect 14, further comprising: preparing a compliant base of the pod door to support the at least one pin.

Aspect 17. The method according to any one of aspects 11-16, further comprising: preparing the second set of pins to be activated when the pod door is transitioned from the unlocked state to the locked state, wherein when the second set of pins is activated, each pin of the second set of pins is pushed toward the baseplate and contacts the baseplate.

Aspect 18. The method according to aspect 17, further comprising: preparing a latch arm of the pod door so that when the pod door is transitioned from the unlocked state to the locked state, the latch arm pushes the second set of pins toward the baseplate so that the second set of pins contacts the baseplate.

Aspect 19. The method according to aspect 17, further comprising: preparing a door cam of the pod door so that when the pod door is in the locked state, the door cam drives the second set of pins toward the baseplate so that the second set of pins contacts the baseplate.

Aspect 20. The method according to any one of aspects 11-19, further comprising: preparing a support pin disposed on the pod door.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes can be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

What is claimed is:

1. An apparatus comprising:
   an inner container having a baseplate and a cover;
   an outer container having a pod dome and a pod door, the pod door having a locked state and an unlocked state; and
   a first set of pins and a second set of pins disposed on the pod door, the first set of pins and the second set of pins being configured to support the baseplate,
   wherein when the pod door is in the unlocked state and the first set of pins contacts the baseplate, a clearance is formed between the second set of pins and the baseplate,
   when the pod door is in the locked state, the first set of pins and the second set of pins contact the baseplate.

2. The apparatus according to claim 1, wherein the outer container includes clamping mechanisms,
   when the pod door is in the locked state, clamping forces exerted from the clamping mechanisms on the cover are not aligned with the first set of pins in a height direction of the inner container.

3. The apparatus according to claim 1, wherein the clearance ranges from at or about 0.1 millimeters to at or about 0.2 millimeters.

4. The apparatus according to claim 1, wherein at least one pin of the first set of pins is compliant in a height direction of the inner container.

5. The apparatus according to claim 4, wherein the at least one pin is a spring-loaded pin.

6. The apparatus according to claim 4, wherein the pod door includes a compliant base to support the at least one pin.

7. The apparatus according to claim 1, wherein the second set of pins is configured to be activated when the pod door is transitioned from the unlocked state to the locked state, when the second set of pins is activated, each pin of the second set of pins is pushed toward the baseplate and contacts the baseplate.

8. The apparatus according to claim 7, wherein the pod door includes a latch arm, when the pod door is transitioned from the unlocked state to the locked state, the latch arm pushes the second set of pins toward the baseplate so that the second set of pins contacts the baseplate.

9. The apparatus according to claim 7, wherein the pod door includes a door cam, when the pod door is transitioned from the unlocked state to the locked state, the door cam drives the second set of pins toward the baseplate so that the second set of pins contacts the baseplate.

10. The apparatus according to claim 1, further comprising:

a support pin disposed on the pod door.

11. A method of producing an apparatus, the apparatus including an inner container having a baseplate and a cover, an outer container having a pod dome and a pod door, the pod door having a locked state and an unlocked state; and a first set of pins and a second set of pins disposed on the pod door, the first set of pins and the second set of pins being configured to support the baseplate, the method comprising:

preparing the first set of pins and the second set of pins so that when the pod door is in the unlocked state and the first set of pins contacts the baseplate, a clearance is formed between the second set of pins and the baseplate, and when the pod door is in the locked state, the first set of pins and the second set of pins contact the baseplate.

12. The method according to claim 11, further comprising:

preparing clamping mechanisms of the outer container so that when the pod door is in the locked state, clamping forces exerted from the clamping mechanisms on the cover are not aligned with the first set of pins in a height direction of the inner container.

13. The method according to claim 11, wherein the clearance ranges from at or about 0.1 millimeters to at or about 0.2 millimeters.

14. The method according to claim 11, further comprising:

preparing at least one pin of the first set of pins so that the at least one pin is compliant in a height direction of the inner container.

15. The method according to claim 14, wherein the at least one pin is a spring-loaded pin.

16. The method according to claim 14, further comprising:

preparing a compliant base of the pod door to support the at least one pin.

17. The method according to claim 11, further comprising:

preparing the second set of pins to be activated when the pod door is transitioned from the unlocked state to the locked state, wherein when the second set of pins is activated, each pin of the second set of pins is pushed toward the baseplate and contacts the baseplate.

18. The method according to claim 17, further comprising:

preparing a latch arm of the pod door so that when the pod door is transitioned from the unlocked state to the locked state, the latch arm pushes the second set of pins toward the baseplate so that the second set of pins contacts the baseplate.

19. The method according to claim 17, further comprising:

preparing a door cam of the pod door so that when the pod door is in the locked state, the door cam drives the second set of pins toward the baseplate so that the second set of pins contacts the baseplate.

20. The method according to claim 11, further comprising:

preparing a support pin disposed on the pod door.

* * * * *